United States Patent [19]

Fujino

[11] Patent Number: 5,311,528
[45] Date of Patent: May 10, 1994

[54] SOLID-STATE LASER DEVICE CAPABLE OF STABLY PRODUCING AN OUTPUT LASER BEAM AT HIGH POWER

[75] Inventor: Masashi Fujino, Tokyo, Japan

[73] Assignee: Hoya Corporation, Tokyo, Japan

[21] Appl. No.: 937,511

[22] Filed: Aug. 28, 1992

[30] Foreign Application Priority Data

Aug. 30, 1991 [JP] Japan .................. 3-220092

[51] Int. Cl.⁵ ............................ H01S 3/045
[52] U.S. Cl. ........................ 372/35; 372/34; 372/75
[58] Field of Search .................. 372/35, 34, 75

[56] References Cited

U.S. PATENT DOCUMENTS 4,791,634 12/1988 Miyake .................. 372/34
5,130,996 7/1992 Amano et al. ............ 372/71

Primary Examiner—James W. Davie
Attorney, Agent, or Firm—Ladas & Parry

[57] ABSTRACT

In a solid-state laser device comprising a solid-state laser medium disposed in a laser resonator and a semiconductor laser device for exciting the solid-state laser medium, the solid-state laser device comprises a vessel for receiving the solid-state laser medium and the semiconductor laser device. The vessel is filled with a refrigerant so that the refrigerant is contact with at least one part of the semiconductor laser device and at least one of the solid-state laser medium. Connected to the vessel, a temperature controlling device controls temperature of the refrigerant to maintain a predetermined desired temperature so that the excitation laser beam has an excitation wavelength which coincides with an absorption wavelength of the solid-state laser medium. The refrigerant may composed of an insulated transparent liquid or an inert gas. Preferably, the temperature controlling device is a circulating temperature controlling device which has an inlet port for introducing a part of the refrigerant from the vessel and an outlet port for returning the part of the refrigerant to the vessel after keeping the part of the refrigerant at the desired temperature.

10 Claims, 4 Drawing Sheets

SOLID-STATE LASER DEVICE CAPABLE OF STABLY PRODUCING AN OUTPUT LASER BEAM AT HIGH POWER

BACKGROUND OF THE INVENTION

This invention relates to a solid-state laser device, more particularly, to a solid-state laser device producing, by using a semiconductor laser device as an excitation light source, an output laser beam.

As well known in the art, a solid-state laser device of the type described comprises a solid-state laser medium disposed in a laser resonator and a semiconductor laser device for exciting the solid-state laser medium by applying an excitation laser beam to the solid-state laser medium to make the solid-state laser medium produce an output laser beam. The excitation laser beam has an excitation wavelength while the solid-state laser medium has an absorption wavelength or an absorption band. If the excitation wavelength does not equal to the absorption wavelength, the solid-state laser device produces the output laser beam with an oscillation efficiency thereof remarkably degraded. It is noted that the excitation wavelength of the excitation laser beam varies in accordance with temperature of the semiconductor laser device. It is therefore necessary to accurately keep the semiconductor laser device at a predetermined desired temperature so that the excitation wavelength of the excitation laser beam equals the absorption wavelength of the solid-state laser medium.

A method of keeping the semiconductor laser device at the predetermined desired temperature is already proposed in U.S. Pat. No. 4,739,507 issued to Byer et al. According to Byer et al, the semiconductor laser device such as a laser diode is cooled by means of a thermoelectric cooler such as a Peltier effect element coupled in good heating exchanging relation with the laser diode via the intermediary of a substrate such as a copper block. In order to obtain the output laser beam at high power, it is necessary for the solid-state laser device to use a number of semiconductor laser devices. Under the circumstances, the semiconductor laser devices must be provided with a number of Peltier effect elements and a number of driving units for driving the Peltier effect elements, respectively. Such a solid-state laser device becomes complex in structure and has a high price. It is therefore difficult for the solid-state laser device to put to practical use.

Another example is disclosed in the technical digest Advanced Solid-State Laser 1991, pdp8-1. According to this technical digest, a radiator is mounted on a substrate on which a plurality of semiconductor laser devices are fixed and cooling water passes through the radiator.

However, each of the above-mentioned conventional methods of cooling the solid-state laser device comprises the steps of adjusting temperature of the substrate so as to maintain the desired temperature and carrying out heat conduction between contact surfaces of the substrate and of the semiconductor laser device or the semiconductor laser devices, whereby temperature of the semiconductor laser device is indirectly controlled so as to maintain the desired temperature. Accordingly, each of the conventional cooling methods is called an indirect cooling method. In such an indirect cooling method, there is a thermal or heat resistance between the contact surfaces. As a result, the indirect cooling method has a poor efficiency and a low stability for control of the temperature. By way of example, it will be assumed that the semiconductor laser device having power of 10 W is drived at the temperature of 20° C. In this event, the semiconductor laser device generates heat of about 30 W. It will also be assumed that the contact surfaces between the substrate and of the semiconductor laser device has the heat resistance of 0.2° C./W. Under the circumstances, it is necessary for the temperature of the substrate to degrade to 14° C. The larger the power of the semiconductor laser device becomes, the wider a temperature difference between the semiconductor laser device and the substrate becomes. Accordingly, a problem occurs in a case where the solid-state laser device comprises the semiconductor laser device having a high power.

As mentioned above, in the conventional cooling methods, it is indispensable to take radiation of heat for the semiconductor laser device into consideration. Therefore, there is a lot of restriction concerned with problems of heat in structure of the solid-state laser device. In addition, limitations lie in as regards the power of the semiconductor laser device to be used and the number of the semiconductor laser devices to be arranged. Furthermore, the solid-state laser device is complex in structure.

In addition, in the conventional solid-state laser device, the solid-state laser medium is merely supported with a supporting member without an active cooling. With this structure, the solid-state laser medium is only cooled at a portion which is in contact with the supporting member. As a result, an irregular temperature distribution easily causes inside the solid-state laser medium to result in distortion due to heat for the solid-state laser medium. Accordingly, such distortion readily gives rise to deterioration in the quality of the output laser beam and to degradation of the solid-state laser medium.

SUMMARY OF THE INVENTION

It is therefore an object of this invention to provide a solid-state laser device which is stably capable of producing an output laser beam.

It is another object of this invention to provide a solid-state laser device of the type described, which is simple in structure.

It is still another object of this invention to provide a solid-state laser device of the type described, which is capable of producing the output laser beam at high power.

Other objects of this invention will become clear as the description proceeds.

In describing the gist of one aspect of this invention, it is possible to understand that a solid-state laser device comprises a solid-state laser medium disposed in a laser resonator and a semiconductor laser device for exciting the solid-state laser medium by applying an excitation laser beam to the solid-state laser medium to make the solid-state laser medium produce an output laser beam.

According to the above-mentioned aspect of this invention, the solid-state laser device comprises a vessel for receiving the solid-state laser device medium and the semiconductor laser device. The vessel is filled with a refrigerant so that the refrigerant is contact with at least one part of the semiconductor laser device and at least one part of the solid-state medium. Connected to the vessel, a temperature controlling device controls temperature of the refrigerant to maintain a predetermined desired temperature so that the semiconductor laser device has a wavelength which equals an absorption wavelength of the solid-state laser medium.

The refrigerant is, for example, composed of an insulated transparent liquid. In place of the insulated transparent liquid, the refrigerant may be composed of inert gas.

Preferably, the temperature controlling device is a circulating temperature controlling device which has an inlet port for taking in a part of the refrigerant from the vessel and an outlet port for returning the part of the refrigerant to the vessel after keeping the part of the refrigerant at the desired temperature.

The excitation laser beam is, for example, incident on a side surface of the solid-state laser medium. The excitation laser beam may be incident on one of a pair of end surfaces of the solid-state laser medium that are opposed to each other and that act as an incident/outgoing surface for a resonance laser beam of the solid-state laser medium.

DESCRIPTION OF THE PREFERRED EMBODIMENTS

Figure 1:
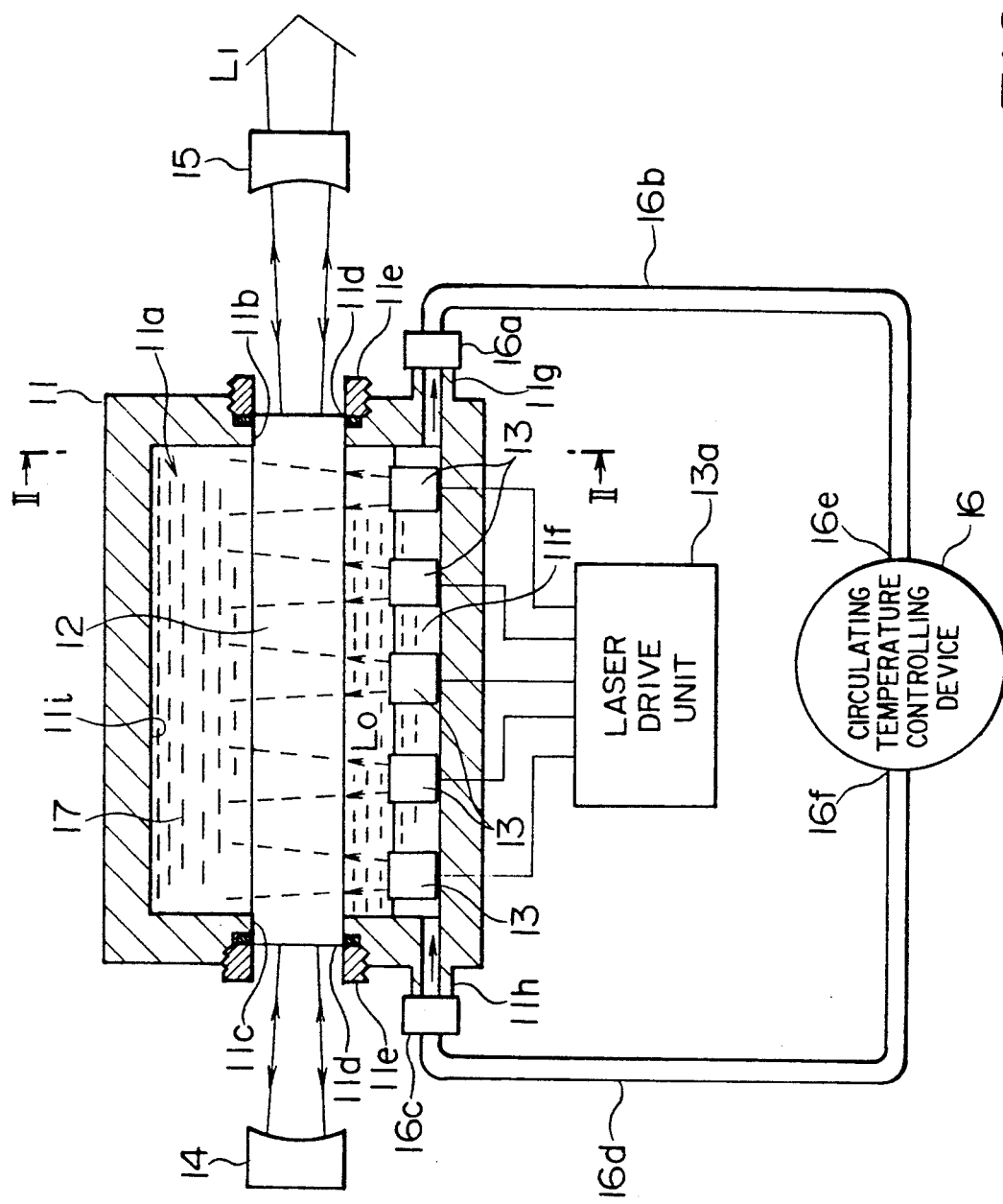
FIG. 1 is a cross sectional view of a solid-state laser device according to a first embodiment of this invention.
Figure 2:
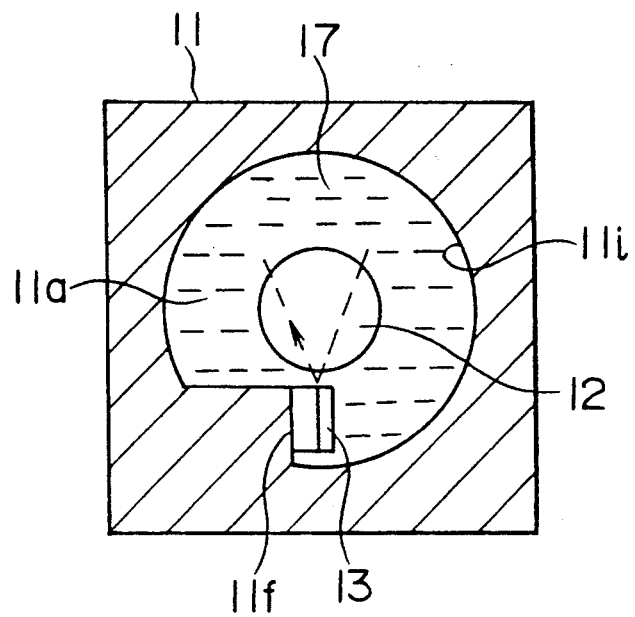
FIG. 2 is a sectional view taken along line II—II in FIG. 1.

Referring to FIGS. 1 and 2, description will proceed of a solid-state laser device according to a first embodiment of this invention. The solid-state laser device comprises a vessel or a housing 11 which has the configuration of a quadratic prism shape and an inner substantially cylindrical hollow space 11a, as illustrated in FIG. 2. The vessel 11 has first and second vessel ends located at righthand and lefthand sides of FIG. 1, respectively. The first and second vessel ends are opened to define first and second threaded windows 11b and 11c, respectively, as shown in FIG. 1. The vessel 11 is made of metal such as aluminum, stainless steel, or the like.

A solid-state laser medium 12 has a cylindrical configuration and is received in the vessel 11 along a vessel axis of the vessel 11 with opposed ends of the solid-state laser medium 12 put in the first and second threaded windows 11b and 11c, respectively. The solid-state laser medium 12 has a medium axis which is coaxial with the vessel axis. A pair of O-rings 11d is inserted between the opposed ends of the solid-state laser medium 12 and the first and second threaded windows 11b and 11c, respectively, and a pair of ring shaped set screws 11e is threaded in the first and the second threaded windows 11b and 11c, respectively, so as to seal and fix the opposed ends of the solid-state laser medium 12. That is, the opposed ends of the solid-state laser medium 12 are exposed to the outside of the vessel 11.

As shown in FIG. 2, the hollow space 11a is defined by an inner surface a part of which is projected along an overall longitudinal length of the vessel 11 in the direction of the vessel axis. The projected part has a portion formed into a flat surface in the direction of the vessel axis. The flat surface serves as a pedestal portion 11f for mounting five semiconductor laser devices 13 which are arranged in predetermined spaces and each of which has an emitting portion opposite a side surface of the solid-state laser medium 12 with a space between the emitting portion and the side surface or incoming portion. Each semiconductor laser device 13 acts as an exciter or an excitation optical source for exciting or pumping the solid-state laser medium 12 by supplying the solid-state laser medium 12 with an excitation or a pumping laser beam L0. At any rate, the semiconductor laser devices 13 are also received in the vessel 11.

In the vessel 11, the inner surface defining the hollow space 11a is formed as a mirror surface which is operable as a reflection surface 11i. In the example illustrated, the reflection surface 11i is made by mirror polishing or grinding the inner surface of the vessel 11. The reflection surface 11i may be made of a reflection film or coating with which the inner surface of the vessel 11 is coated.

The solid-state laser medium 12 is made of an Nd:YAG laser rod for oscillating the output laser beam L1 having an oscillation wavelength of 1064 nm. The Nd:YAG laser rod has a diameter of 3 mm and a length of 30 mm. The Nd:YAG laser rod has opposite ends each of which is polished and flat and is coated with an antireflection film or coating for the output laser beam L1. The solid-state laser medium 12 has a peak absorption wavelength of 807 nm. The solid-state laser medium 12 may be made of an Nd:YLF laser rod having a peak absorption wavelength of 795 nm.

The semiconductor laser device 13 is of GaAs-type and generates, as the excitation laser beam L0, a laser beam having an excitation waveband between 790 to 820 nm and has a power of 5 W. In the case where the solid-state laser device comprises a plurality of semiconductor laser devices, it is necessary that the semiconductor laser devices are uniform in an excitation wavelength when the semiconductor laser devices are operable at a uniform temperature. For example, it is necessary that each of the five semiconductor laser devices 13 has the excitation wavelength of 807 nm at a predetermined desired temperature of 25° C. when the solid-state laser medium 12 is made of the Nd:YAG laser rod having the optical absorption peak wavelength of 807 nm. When the solid-state laser medium 12 is made of the Nd:YLF laser rod having the peak absorption wavelength of 785 nm, it is necessary that each of the five semiconductor laser devices 13 has the excitation wavelength of 795 nm at a uniform temperature. Each of the semiconductor laser devices 13 is driven by a laser drive unit 13a located outside of the vessel 11.

The solid-state laser medium 12 is put between a full reflection mirror 14 and an output mirror 15 in the longitudinal direction thereof. The full reflection mirror 14 and the output mirror 15 are cooperatively operable as a laser resonator for the output laser beam L1. In other words, the solid-state laser medium 12 is disposed in the laser resonator. Each of the full reflection mirror 14 and the output mirror 15 has a concave reflection surface opposite the end surface of the solid-state laser medium 12.

For example, the full reflection mirror 14 has a concave reflection surface with a radius of curvature of 5 m. The output mirror 15 is made of a concave lens-shaped glass body having a concave reflection surface with a radius of curvature of 5 m and which is coated with a reflection film composed of a dielectric multilayer film. The reflection film has a transmittance of 3% for the output laser beam L1. Therefore, the output mirror 15 acts in cooperation with the full reflection mirror 14 as the laser resonator having a resonator length of 100 mm.

The solid-state laser device further comprises a circulating temperature controlling device 16 connected to the vessel 11 for controlling the temperature of a refrigerant 17 with which the vessel 11 is filled. The refrigerant 17 is in contact with at least one part of the semiconductor laser devices 13 and at least one part of the solid-state laser medium 12.

In the example illustrated, the refrigerant 17 is composed of a cooling liquid which is transparent to the excitation laser beam and which has a high electrical insulation property. For example, as the cooling liquid may be used "FLUORINERT", a trade mark of the 3M Co., which is one a fluorocarbon compound which is used as a cooling solvent for cooling semiconductor parts or the like. The "FLUORINERT" has a transmittance greater than 90% for the excitation laser beam having the excitation wavelength of 807 nm which the semiconductor laser device 13 generates, has an extremely high dielectric strength of about 30 kV, and is thermally and chemically stable. Therefore, the "FLUORINERT" never disturbs the operation of the semiconductor laser device 13 nor damages the emitting portion of the semiconductor laser device 13. In addition, the "FLUORINERT" has a heat conductivity twice as great as that of a silicone oil and therefore serves as the most suitable cooling liquid. The refrigerant 17 may also be composed of the silicone oil.

The vessel 11 is provided with a vessel outlet hole 11g and a vessel inlet hole 11h in the first and the second ends therefor, respectively. The vessel outlet hole 11g is for discharging a part of the refrigerant 17 from the vessel 11 while the vessel inlet hole 11h is for supplying the vessel 17 with the refrigerant 17. The vessel outlet hole 11g is coupled by means of a first junction metal fitting 16a to an end of a first refrigerant pipe 16b while the vessel inlet hole 11h is coupled by means of a second junction metal fitting 16c to an end of a second refrigerant pipe 16d. The first refrigerant pipe 16b has another end coupled to a refrigerant inlet port 16e of the circulating temperature controlling device 16 while the second refrigerant pipe 16d has another end coupled to a refrigerant outlet port 16f of the circulating temperature controlling device 16.

The circulating temperature controlling device 16 includes a circulating pump (not shown) and a temperature controller (not shown). The circulating pump is for introducing the part of the refrigerant 17 into the circulating temperature controlling device 16 from the vessel 11 via the vessel outlet hole 11g, the first refrigerant pipe 16b, and the refrigerant inlet port 16e and for returning the part of the refrigerant 17 from the circulating temperature controlling device 16 to the vessel 11 via the refrigerant outlet port 16f, the second refrigerant pipe 16d, and the vessel inlet hole 11h so as to circulate the refrigerant 17 in the vessel 11. The temperature controller controls the temperature of the introduced refrigerant so as to maintain the predetermined desired temperature.

Now, operation will be described with reference to FIG. 1 for a better understanding of this invention.

The refrigerant 17 is maintained at the predetermined desired temperature of 25° C. by the circulating temperature controlling device 16. On this condition, the semiconductor laser devices 13 are driven by the laser drive unit 13a in order to apply the solid-state laser medium 12 with the excitation laser beam L0 having the excitation wavelength of 807 nm and therefore to make the solid-state laser device carry out laser oscillation. In this event, it is possible to obtain the output laser beam L1 which as the oscillation wavelength of 1064 nm, an extremely high power of 3 W, and has therefore an excellent beam characteristic.

In this connection, in order to obtain the same power in the conventional solid-state laser device, it is necessary to connect water cooled lines to base portions of all of the semiconductor laser device 13 and therefore the conventional solid-state laser device is complex in structure and large in size. In contrast with this, the solid-state laser device according to the first embodiment is simple in structure and is therefore relatively compact.

Figure 3:
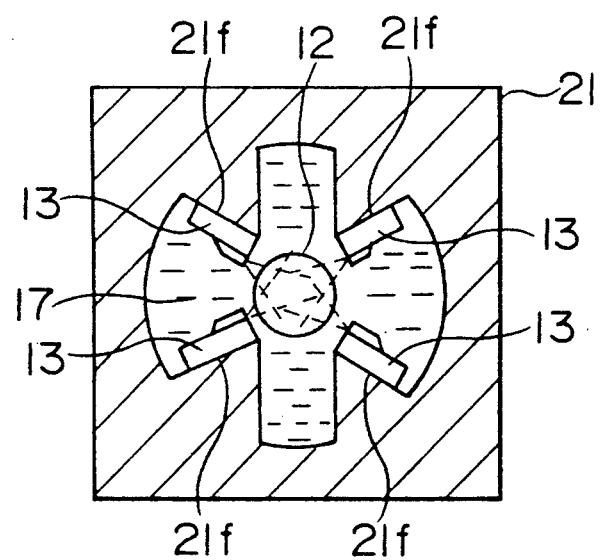
FIG. 3 is a sectional view, like FIG. 2, of a solid-state laser device according to a second embodiment of this invention.

Referring to FIG. 3, a solid-structure laser device according to a second embodiment of this invention is basically similar to that illustrated in FIGS. 1 and 2 except that the solid-state laser device comprises a vessel 21 which differs from the vessel 11 in FIGS. 1 and 2 in that it incorporates twenty semiconductor laser devices 13 or four times as much as those in the first embodiment.

The vessel 21 comprises four pedestal portions 21f which are radially arranged in the vicinity of the solid-state laser medium 12 and each of which corresponds to the pedestal portion 11f in FIG. 1 and 2. On each pedestal portion 21f are mounted five semiconductor laser devices 13 and therefore the vessel 21 receives twenty semiconductor laser devices 13 in totality. With this structure, it is possible to obtain an output laser beam which is extremely stable and which has extremely high power of about 9 W.

Figure 4:
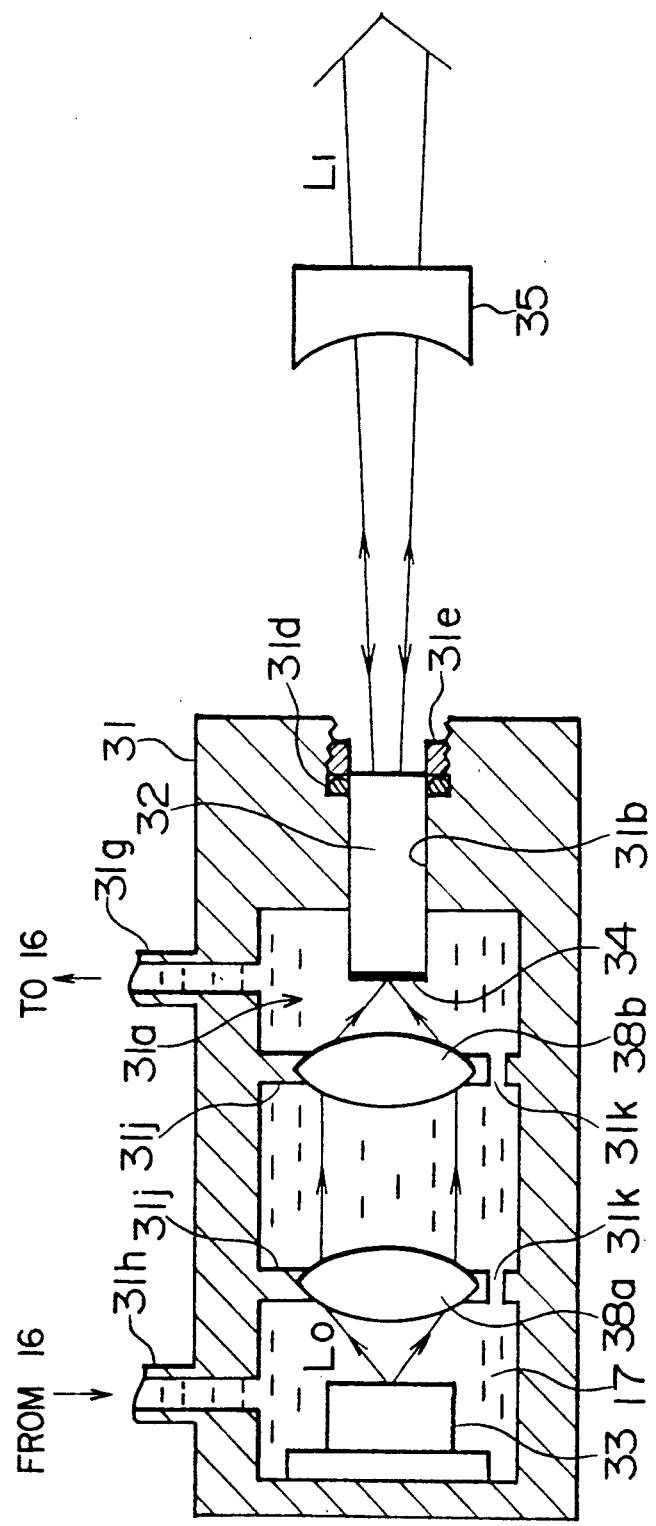
FIG. 4 is a cross sectional view of a solid-state laser device according to a third embodiment of this invention.

Referring to FIG. 4, description will proceed to a solid-state laser device according to a third embodiment of this invention. The illustrated solid-state laser device comprises a vessel or a housing 31 which has the configuration of a quadratic prism shape and an inner substantially cylindrical hollow space 31a. The housing 31 has first and second housing ends located at righthand and lefthand sides of FIG. 4, respectively. The first housing end has a relatively thick wall and is opened to define a substantially cylindrical through hole 31b which extends along a housing axis of the housing 31 while the second housing end is closed. The cylindrical through hole 31b has a hole diameter and has a threaded portion in the righthand side in FIG. 4.

A solid-state laser medium 32 has a cylindrical configuration and has a medium diameter which is substantially equal to the hole diameter of the through hole 31b. The solid-state laser medium 32 has first and second medium ends located at righthand and lefthand sides of FIG. 4, respectively. The solid-state laser medium 32 is inserted in the cylindrical through hole 31b with a lefthand side part of the solid-state laser medium 32, that corresponds to about one-third thereof, projected into the hollow space 31a. An O-ring 31d is inserted between the first medium end of the solid-state laser medium 32 and the threaded portion of the through hole 31b and then a ring shaped set screw 31e is threaded in the threaded portion of the through hole 31b so as to seal and fix the first medium end of the solid-state laser medium 32. That is, the solid-state laser medium 32 is arranged along the housing axis of the housing 31 and has the first and the second medium ends which are exposed to the outside of the housing 31 and into the hollow space 31a, respectively.

The solid-state laser medium 32 is made of an Nd:YAG laser rod for oscillating an output laser beam L1 having an oscillation wavelength of 1064 nm. The Nd:YAG laser rod has a diameter of 3 mm, a length of 5 mm, and has a peak absorption wavelength of 807 nm. The solid-state laser medium 32 may be made of an Nd:YLF laser rod, an Nd:glass rod, an Er:YAG laser rod, an Er:YLF laser rod, an Er:glass rod, or the like. The solid-state laser medium 32 may has a slab-shaped configuration or a polyhedron-shaped configuration. In this event, of course, conditions of a laser resonator or the like are selected in accordance with each solid-state laser medium.

On the second housing end of the housing 31, a semiconductor laser device 33 is mounted. The semiconductor laser device 33 is operable as an exciter or an excitation optical source to generate an excitation laser beam L0. The semiconductor laser device 13 is of GaAs-type and generates, as the excitation laser beam L0, a laser beam having an excitation waveband between 802 and 820 nm and has a power of 500 mW. The semiconductor laser device 13 has an excitation wavelength of 807 nm at a predetermined desired temperature of 25° C. that equals the peak absorption wavelength of the Nd:YAG laser rod. In addition, the semiconductor laser device is driven by a laser drive unit (not shown).

On the second medium end of the solid-state laser medium 32, an optical thin film 34 is coated, as illustrated by a thick line in FIG. 4. The optical thin film 34 is composed of a dielectric multilayer film having a reflectance greater than 99.9% for the output laser beam L1 having the oscillation wavelength of 1064 nm and has a transmittance greater than 85% for the excitation laser beam L0 having the excitation wavelength of 807 nm. On the first medium end of the solid-state laser medium 32, an antireflecting coating (not shown) is coated which has a reflectance which is not greater than 0.5% for the output laser beam L1.

On the other hand, the first medium end of the solid-state laser medium 32 is opposed to an output mirror 35 with a space left therebetween. The output mirror 35 is made of a concave lens-shaped glass body having a concave reflection surface which has radius of curvature of 30 mm and which is coated with a reflection film composed of a dielectric multilayer film. The reflection film has a transmittance of 3% for the output laser beam L1. The output mirror 35 serves in cooperation with the optical thin film 34 as a laser resonator having a resonator length of 25 mm.

The excitation laser beam L0 is sent along a traveling path through an optical system which is composed of first and second convex lenses 38a and 38b and which serves to collect the excitation laser beam L0 onto the solid-state laser medium 32. At any rate, the excitation laser beam L0 is collected or gathered into the solid-state laser medium 32. The optical system has a collection degree so that the excitation laser beam L0 has a mode volume which is substantially equal to that of the output laser beam L1. The first and the second convex lenses 38a and 38b are supported by two ring-shaped lens holders 31i protruding from an inner wall of the housing 31 inside the space 31a of the housing 31. In each lens holder 31i, a refrigerant communication hole 31k is made to allow a refrigerant 17 filled in the housing 31 to freely communicate in the hollow space 31a.

The housing 31 is provided with a housing outlet hole 31g and a housing inlet hole 31h in righthand and lefthand sides thereof, respectively. The housing outlet hole 31g and the housing inlet hole 31h are coupled to a circulating temperature controlling device (not shown) which is similar that illustrate in FIG. 1 and which circulates the refrigerant 17 so as to keep the refrigerant 17 at the predetermined desired temperature of 25° C. The refrigerant 17 may be composed of a cooling liquid which is similar to that illustrated in FIGS. 1 and 2.

With this structure, it is possible to accurately maintain the semiconductor laser device 33 at the predetermined desired temperature of 25° C. by the refrigerant 17 so as to always exactly keep the excitation laser beam L0 at the excitation wavelength of 807 nm. In addition, it is possible to maintain the solid-state laser device 32 at the predetermined desired temperature of 25° C. by the refrigerant 17. It is therefore possible to obtain the output laser beam L1 having an excellent beam characteristic having end excitation. In addition, it is possible to provide the solid-state laser device of end excitation type which is small in size and is compact. When the solid-state laser device carries out laser oscillation with the refrigerant 17 maintained at the predetermined desired temperature of 25° C., it is possible to obtain the output laser beam L1 which has the oscillation wavelength of 1064 nm, has an power of 150 mW, and has the excellent beam characteristics for both of longitudinal and transverse modes.

Figure 5:
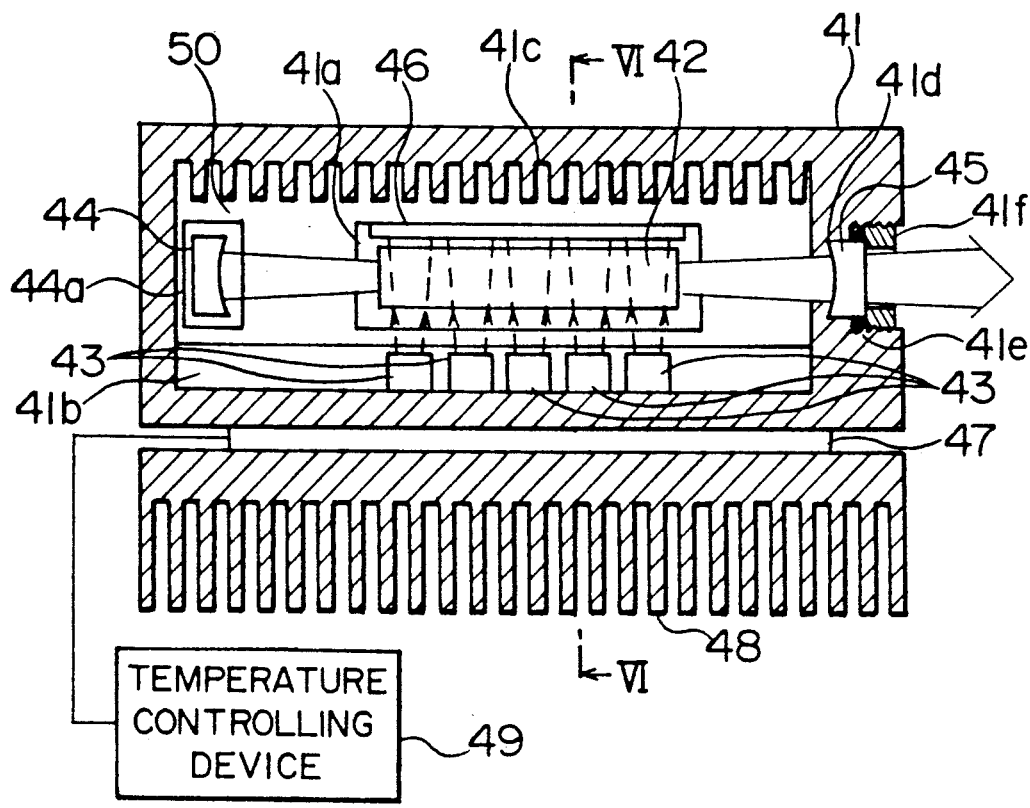
FIG. 5 is a cross sectional view of a solid-state laser device according to a fourth embodiment of this invention.
Figure 6:
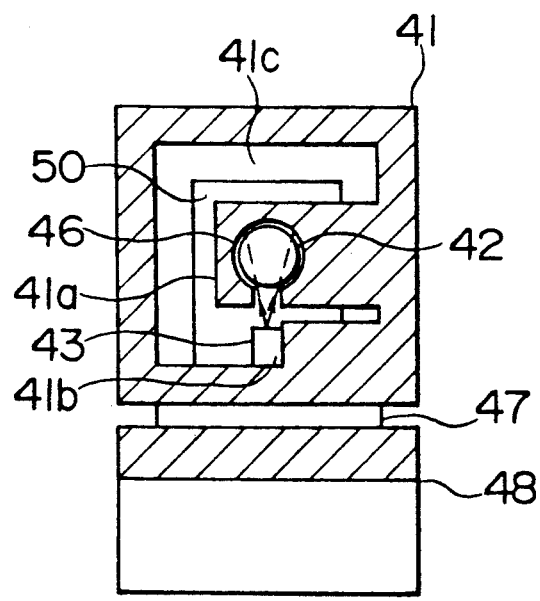
FIG. 6 is a sectional view taken along line VI—VI in FIG. 5.

Referring to FIGS. 5 and 6, description will proceed for a solid-state laser device according to a fourth embodiment of this invention. The illustrated solid-state laser device comprises a vessel or a housing 41 which has the configuration of a quadratic prism shape and an inner hollow space. The housing 41 comprises a projection portion 41a for fixing a solid-state laser medium 42 and a pedestal portion 41b for fixing five semiconductor laser devices 43. In the projection portion 41a is bored a cavity which has a shape corresponding to that of the solid-state laser medium 42. The cavity has an inner surface which is formed as a reflection surface 46 so as to reflect, as a reflected laser beam, an excitation laser beam L0 transmitting the solid-state laser medium 42 and to make the solid-state laser medium 42 reabsorb the reflected laser beam. The pedestal portion 41b has a structure such that a part of an inner surface of the housing 41 is projected in the direction of the projection portion 41a. On the pedestal portion 41b are mounted the five semiconductor laser devices 43 which are arranged at regular intervals and each of which has an emitting portion opposite a side surface of the solid-state laser medium 42 with a space left between the emitting portion and the side surface.

Within the housing 41, a refrigerant gas 50 is enclosed at a high pressure of about 3 atm. On the inner surface of the housing 41 except for the pedestal portion 41b, a heat exchanger portion 41c is mounted to carry out heat exchange between the housing and the refrigerant gas 50. In order to effectively carry out the heat exchange, the heat exchanger portion 41c has a plurality of fins extending in the direction of the projection portion 41b and therefore having a comb shape in section, as illustrated in FIG. 5. The refrigerant gas 50 absorbs heat generated by the semiconductor laser devices 43 and the solid-state laser medium 42. In order to radiate the absorbed heat, the refrigerant gas 50 carries out heat conduction to the heat exchanger portion 41c by natural convection.

The housing 41 has first and second housing ends located at righthand and lefthand sides of FIG. 4, respectively. The first housing end is opened to define a laser outgoing opening 41d for producing an output laser beam L1 while the second housing end is closed. In the laser outgoing opening 41d is inserted an output mirror 45 which is sealed and fixed by an O-ring 41e and a ring shaped set screw 41f so as to tightly shut the inner space of the housing 41.

On the bottom of an outer surface of the housing 41, a radiator 48 is mounted via a thermoelectric cooler 47 such as a Peltier effect element to radiate heat generated by the semiconductor laser devices 43 and the solid-state laser medium 42. In order to effectively radiate heat, the radiator 48 has a plurality of fins which extend downwards in FIG. 5 and therefore has a comb shape in section, as illustrated in FIG. 5. The thermoelectric cooler 47 is connected to a temperature controlling device 49 which is placed outside the housing 41 and therefore keeps the housing 41 at the predetermined desired temperature. With this structure, the solid-state laser medium 42 and the semiconductor laser devices 43 received in the housing 41 are cooled by cooling all of the housing 41.

The solid-state laser medium 42 is made of an Nd:YAG laser rod for oscillating an output laser beam L1 having an oscillation wavelength of 1064 nm. The Nd:YAG laser rod has a diameter of 3 mm, a length of 30 mm, and has opposite ends each of which is polished with flat and is coated with an antireflection film for the output laser beam L1. The solid-state laser medium 42 has an optical absorption peak wavelength of 807 nm.

In the vicinity of the side surface of the solid-state laser medium 42, the five semiconductor laser devices 43 are arranged along an optical axis of the solid-state laser medium 42 in a line at regular intervals. The excitation laser beam L0 which is produced by each semiconductor laser device 43 excites the solid-state laser medium 42 from the side surface of the solid-state laser medium 42. Each of the semiconductor laser devices 43 generates the excitation laser beam L0 having a power of 5 W and thus the five semiconductor laser devices 43 generate the excitation beams L0 which have a power of 25 W in totality. The excitation wavelength of each semiconductor laser device 43 is temperature controlled by the temperature controlling device 49 so as to coincide with the peak absorption wavelength of the solid-state laser medium 42, namely, 807 nm. In addition, each semiconductor laser device 43 is driven by a power source (not shown).

At the lefthand side inside the housing 41, a full reflection mirror 44 is disposed which is a full reflection concave mirror at the oscillation wavelength and has radius of curvature of 5 m. The full reflection mirror 44 is mounted on a full reflection mirror fastener 44a which is disposed in the housing 41 and has an adjusting mechanism (not shown) for adjusting an angle of the full reflection mirror 44. The output mirror 45 is a concave mirror having a radius of curvature of 5 m and a reflectance of about 95% of the output laser beam L1 at the oscillation wavelength. As mentioned before, the output mirror 45 is fixed in the laser outgoing opening 41d. A combination of the full reflection mirror 44 and the output mirror 45 serves as a laser resonator.

The refrigerant gas 50 enclosed in the housing 41 is an inert gas having a small molecular weight such as helium (He), neon (Ne) or the like. Such an inert gas easily moves an absorption of heat and has the property of high heat conduction. For example, helium has a heat conductivity of 0.14 $Wm^{-1}K^{-1}$ which is six times as great as that of nitrogen (N). It is necessary for the refrigerant gas to include as little moisture as possible because the semiconductor laser device is specially weak in a moist environment. It is therefore desirable that the refrigerant gas has relative humidity of about 20%. The refrigerant gas 50 is enclosed in the housing 41 from a gas intake (not shown). Although the refrigerant gas 50 is enclosed in the housing 41 in the instant embodiment, the refrigerant gas may be circulated with the refrigerant gas temperature adjusted by an outside cooler. In place of the refrigerant gas, a refrigerant liquid may be enclosed in the housing 41.

With this structure, although the solid-state laser medium 42 and the semiconductor laser devices 43 are indirectly cooled by cooling the housing 41, the solid-state laser medium 42 and the semiconductor laser devices 43 are efficiently cooled. This is because the refrigerant gas 50 is enclosed inside the housing 41 at high pressure so that molecules of the refrigerant gas 50 absorb heat which the solid-state laser medium 42 and the semiconductor laser devices 43 generate and then conduct the absorbed heat to the heat exchanger portion 41c mounted on the inner surface of the housing 41 and having a plurality of fins. Inasmuch as the refrigerant gas 50 enters into a minute gap of contact surfaces between the solid-state laser medium 42 and the projection portion 41a and another minute gap of contact surfaces between the semiconductor laser devices 43 and the pedestal portion 41b so as to aid heat conduction between those contact surfaces, it is possible to degrade heat resistance in those contact surfaces.

The use of gas as the refrigerant has the characteristics as follows: It is possible to convert the excitation laser beam into the output laser beam at a high conversion efficiency because of a small optical loss due to absorption in the refrigerant; It is possible to receive the mirror composing the laser resonator as well as the solid-state laser medium and the semiconductor laser devices in the housing; Maintenance is easy because it is unnecessary to provide the outside cooler, pipe arrangement or the like when the refrigerant gas is enclosed in the housing; Gas is cheap in comparison with liquid; and it is effective for a solid-state laser device having a few semiconductor laser devices and a relatively low power because it has a heat conductivity lower than that of liquid.

What is claimed is:

1. A solid-state laser device comprising a solid-state laser medium disposed in a laser resonator and a semiconductor laser device for exciting said solid-state laser medium by applying an excitation laser beam emitted from an emitting portion of said semiconductor laser device to an incoming portion of said solid-state laser medium to make said solid-state laser medium produce an output laser beam, said solid-state laser device further comprising:

a vessel for receiving said solid-state laser medium and said semiconductor laser device, said vessel being filled with a refrigerant so that said refrigerant is in direct contact with at least said emitting portion of said semiconductor laser device and at least said incoming portion of said solid-state laser medium, said refrigerant being transparent to said excitation laser beam and having a high electrical insulation property; and a temperature controlling device connected to said vessel for controlling temperature of said refrigerant to maintain a predetermined desired temperature so that said semiconductor laser device emits said excitation laser beam at a wavelength which equals an absorption wavelength of said solid-state laser medium.

2. A solid-state laser device as claimed in claim 1, wherein said refrigerant is a liquid.

3. A solid-state laser device as claimed in claim 1, wherein said refrigerant is an inert gas.

4. A solid-state laser device as claimed in claim 1, wherein said temperature controlling device comprises a circulating temperature controlling device which has an inlet port for introducing a part of said refrigerant from said vessel and an outlet port for returning said part of the refrigerant to said vessel after keeping said part of the refrigerant at said desired temperature.

5. A solid-state laser device as claimed in claim 1, wherein said solid-state laser medium has a side surface, and wherein said excitation laser beam is incident on said side surface.

6. A solid-state laser device as claimed in claim 1, wherein said solid-state laser medium has a pair of opposite end surfaces which respectively serve as incident and outgoing surfaces for a resonance laser beam thereof, said excitation laser beam being incident on said incident end surface.

7. A solid-state laser device as claimed in claim 1, wherein said laser medium and said laser device are both supported by said vessel so that the emitting portion of the laser device faces the incoming portion of the laser medium in spaced relation, both said emitting portion and said incoming portion being immersed in said refrigerant.

8. A solid-state laser device as claimed in claim 7, wherein said laser medium and said laser device are axially aligned.

9. A solid-state laser device as claimed in claim 7, wherein said laser medium has an outer surface constituting said incoming portion, said emitting portion of the laser device being radially disposed relative to said laser medium and facing the outer surface thereof.

10. A solid-state laser device as claimed in claim 7, wherein said emitting surface of the laser device extends axially of said laser medium along the length thereof.

* * * * *